(12) United States Patent
Hang et al.

(10) Patent No.: US 7,687,417 B2
(45) Date of Patent: Mar. 30, 2010

(54) LEAD FREE GLASS(ES), THICK FILM PASTE(S), TAPE COMPOSITION(S) AND LOW TEMPERATURE COFIRED CERAMIC DEVICES MADE THEREFROM

(75) Inventors: Kenneth Warren Hang, Hillsborough, NC (US); Kumaran Manikantan Nair, Head of the Harbor, NY (US); Mark Frederick McCombs, Clayton, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 372 days.

(21) Appl. No.: 11/543,742

(22) Filed: Oct. 5, 2006

(65) Prior Publication Data

US 2007/0111876 A1 May 17, 2007

Related U.S. Application Data

(60) Provisional application No. 60/737,280, filed on Nov. 16, 2005.

(51) Int. Cl.
- *C03C 10/00* (2006.01)
- *C03C 3/068* (2006.01)
- *C03C 3/253* (2006.01)
- *C03C 3/19* (2006.01)
- *C03C 3/21* (2006.01)

(52) U.S. Cl. .............. 501/10; 501/2; 501/32; 501/47; 501/50; 501/78; 428/210; 428/426; 428/432; 428/434; 524/403; 524/492

(58) Field of Classification Search ............. 501/32, 501/50, 78, 2, 10, 47; 428/210, 426, 432, 428/434; 524/403, 492
See application file for complete search history.

(56) References Cited

U.S. PATENT DOCUMENTS

| | | | |
|---|---|---|---|
| 5,164,342 A | 11/1992 | Muralidhar et al. | |
| 5,258,335 A | 11/1993 | Muralidhar et al. | |
| 6,147,019 A | 11/2000 | Donohue | |
| 6,495,482 B1 * | 12/2002 | de Sandro et al. | 501/50 |
| 6,841,493 B2 * | 1/2005 | Cho et al. | 501/32 |

FOREIGN PATENT DOCUMENTS

| | | |
|---|---|---|
| DE | 10102296 | 2/2002 |
| JP | 60-221338 A * | 11/1985 |
| WO | WO2005/115936 A2 * | 12/2005 |

OTHER PUBLICATIONS

European Search Report in Corresponding European Application No. 06022127.2, dated Sep. 5, 2007.

* cited by examiner

*Primary Examiner*—Anthony J Green

(57) ABSTRACT

A glass composition consisting essentially of, based on mole percent, 46-56% $B_2O_3$, 0.5-8.5% $P_2O_5$, $SiO_2$ and mixtures thereof, 20-50% CaO, 2-15% $Ln_2O_3$ where Ln is selected from the group consisting of rare earth elements and mixtures thereof; 0-6% $M'_2O$ where M' is selected from the group consisting of alkali elements; and 0-10% $Al_2O_3$, with the proviso that the composition is water millable.

24 Claims, 7 Drawing Sheets

US 7,687,417 B2

LEAD FREE GLASS(ES), THICK FILM PASTE(S), TAPE COMPOSITION(S) AND LOW TEMPERATURE COFIRED CERAMIC DEVICES MADE THEREFROM

This application claims the benefit of U.S. Provisional Patent Application Ser. No. 60/737,280, filed Nov. 16, 2005.

FIELD OF THE INVENTION

The invention relates to glass, paste and tape composition (s) suitable for application to the manufacture of multilayer LTCC circuits. The tape exhibits process and materials compatibility with conductors and passive electronic materials when used to build high density, LTCC circuits. The non-toxic tape is also suitable for use with Pb free solders and plated metal circuit contact systems used in newer LTCC tape structures. The tape is characterized as having low dielectric loss over frequencies up to 90 GHz or higher; it also excels in chemical durability, hermeticity, mechanical strength and processing latitude.

TECHNICAL BACKGROUND OF THE INVENTION

An interconnect circuit board is a physical realization of electronic circuits or subsystems made from a number of extremely small circuit elements that are electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. Such a multilayer structure allows a circuit to be more compact.

The elimination of toxic materials from the chemical constituency of LTCC tape materials is a desired goal to reduce the environmental impact caused by public disposal of electronic materials in worldwide community waste disposal systems. This tape is designed to eliminate potentially toxic constituents. The tape exhibits a uniform and low dielectric constant (6-8) with low dielectric loss performance over a broad range of frequency up to 90 GHz or sometimes higher depending on the metal loading. The tape is chemically resistant to acidic plating baths used for metal addition to a base layer of printed conductive.

Typically, a LTCC tape is formed by casting a slurry of inorganic solids, organic solids and a fugitive solvent on a removable polymeric film. The slurry consists of glass powder(s) and ceramic oxide filler materials and an organic based resin-solvent system (medium) formulated and processed to a fluid containing dispersed, suspended solids. The tape is made by coating the surface of a removable polymeric film with the slurry so as to form a uniform thickness and width of coating.

SUMMARY OF THE INVENTION

The present invention is a glass composition consisting essentially of, based on mole percent, 46-56% $B_2O_3$, 0.5-8.5% $P_2O_5$, $SiO_2$ and mixtures thereof, 20-50% CaO, 2-15% $Ln_2O_3$ where Ln is selected from the group consisting of rare earth elements and mixtures thereof; 0-6% $M'_2O$ where M' is selected from the group consisting of alkali elements; and 0-10% $Al_2O_3$, with the proviso that the composition is water millable.

BRIEF DESCRIPTION OF THE DRAWINGS

The data in FIGS. 1, 2 and 3 were obtained by a fused silica dilatometer on 2-inch length specimens.

DETAILED DESCRIPTION OF THE INVENTION

Figure 1:
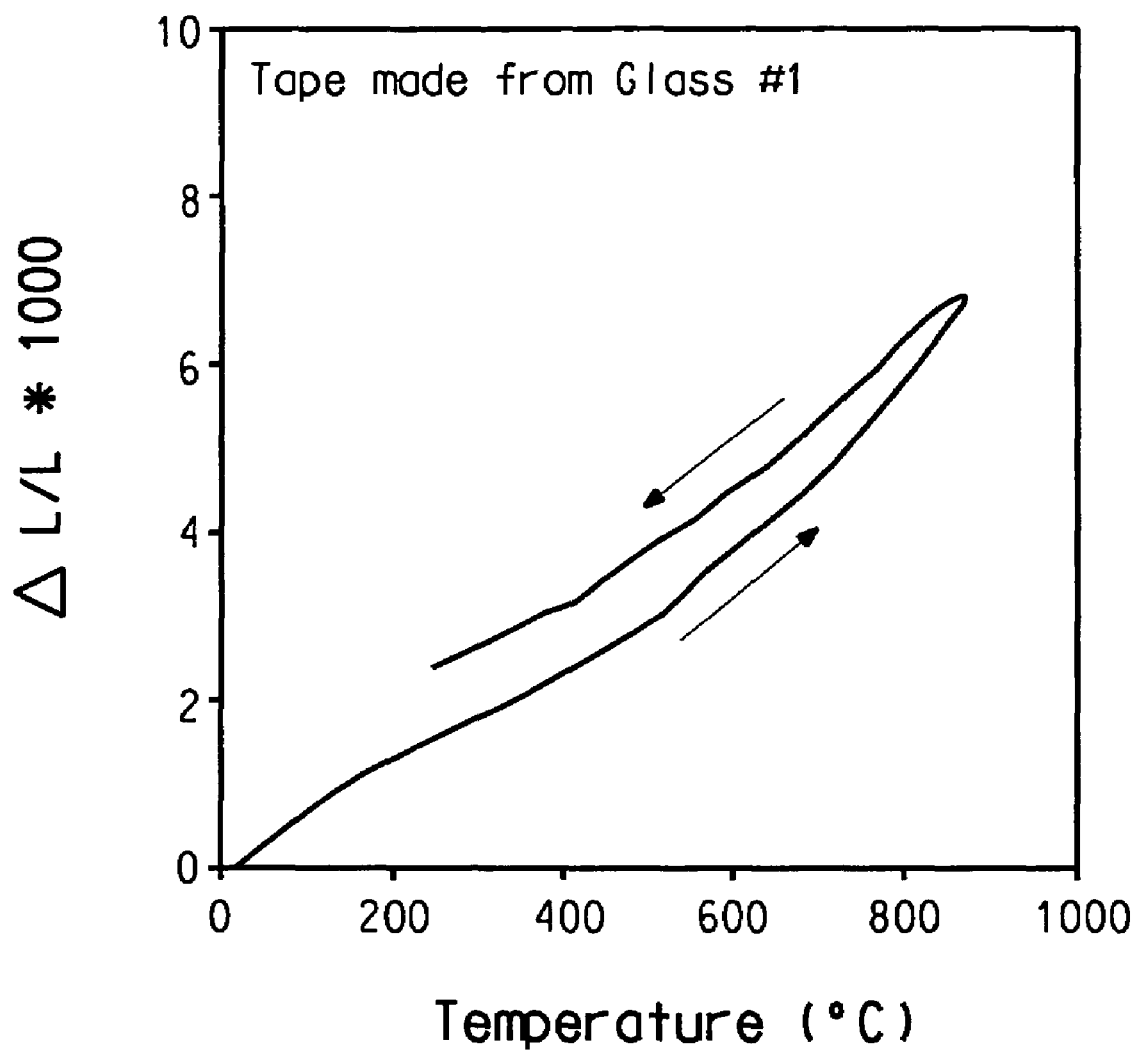
FIG. 1 shows the thermal expansion behavior taken upon both the heating and cooling of the glass #1 in a tape formulation.

In working with U.S. Pat. No. 6,1476,019, it was noted that the dielectric tape had some continuing interaction with Ag bearing conductors with repeated refires. The interaction might result in the Ag based conductor increasing its resistivity following each refire and the conductor resistance doubling after as little as 4 refires.

It has been observed that during the firing of an LTCC circuit laminate, the glass softens and crystallization initiates. As the temperature and/or time increases, more of the crystal species grow from the glass melt; resulting in crystals surrounded by a low viscosity "remnant glass". At the firing temperature, this low viscosity "remnant glass" may react with the conductor composition causing an increase in the conductor resistivity. In extreme cases, the conductor lines dissipate within the fired film causing shorting, lack of electrical connectivity, reliability degradation, etc. This is particularly true for applications requiring narrow lines and spaces between conductor lines. Furthermore, newer LTCC circuits require the use of tape having a thickness on the order of 0.1 mm-0.3 mm and tape laminates of 20 or more layers. Processing steps of such thick laminates require a long heating profile of 30 hours or more. Such a long heating profile increases the interaction between the low viscosity "remnant glass" and conductor components resulting in increased conductor property degradation. In order to reduce conductor property degradation and improve the reliability of the circuit, the viscosity of the "remnant glass" may be increased by adding "glass network formers" such as $SiO_2$ and/or $P_2O_5$. These added "network formers" are expected to remain within the "remnant glass" network and increase the viscosity of the "remnant glass" at the firing temperature. As disclosed in U.S. Pat. No. 6,147,019 to Donohue incorporated herein by reference, the addition of $SiO_2$ to the glass network or to the tape formulation results in high dielectric losses. For this reason, efforts to raise the viscosity of the glass by incorporation of $SiO_2$ appeared to be adverse to the desirable low loss characteristics of the tape dielectric properties. In the present application, glasses were prepared with lower amounts of $SiO_2$ than shown in Donohue to raise the glass, "remnant glass", viscosity. The addition of $P_2O_5$ into network is expected to increase the high temperature viscosity of the "remnant glass". The favorable results of this plan could not be anticipated, as possible loss of desired properties was an expected outcome due to the teachings of Donohue.

The present invention is directed to a glass composition, paste composition and an LTCC tape composition suitable for a variety of circuit manufacturing needs. The materials are characterized by their freedom from toxic metal oxides. The materials are designed to process at the standard 850-875 degrees C. found in current tape dielectric materials. The tape is designed to co-fire with conductors and other passive electrical components applied by screen printing or tape laminating. The properties of the fired LTCC tape have very low dielectric loss characteristics for applications pushing the current upper limits of circuit operation frequency up to 90 GHz or higher.

The glass component of the LTCC tape is an important determinant of many tape properties including the physical and chemical compatibility with other circuit forming materials, dielectric performance, chemical resistance and hermeticity. This invention was unexpectedly discovered during an effort to improve process latitude and conductor and passive component compatibility properties of a related LTCC tape, originally described in U.S. Pat. No. 6,147,019 invented by Paul C. Donohue and assigned to E. I. du Pont de Nemours and Company. The unexpected discovery was realized when properties of LTCC tape made as described in U.S. Pat. No. 6,147,019 Table 1, glass composition # 16 was compared to tape made from modified glasses of the current invention. The goal was to increase processing latitude and improve the compatibility with Ag bearing conductor materials without sacrificing the chemical durability, hermeticity or dielectric loss properties of the fired tape.

For this reason, compositional modification of the glass used in the tape dielectric was initiated to determine whether improvement in conductor interaction properties could be achieved, while maintaining the value of the tape dielectric performance. It was hoped that the incorporation of other glass former additions might raise the viscosity of the glass to decrease the firing sensitivity and potentially improve Ag conductor interaction issues. However, it was unknown whether adverse property changes might develop as a consequence of the composition modifications. So, many of the glasses tested were designed with $P_2O_5$ and $SiO_2$ additions.

The glass(es) of the present invention are "ceramic-filled devitrified glass composition(s)." Devitrified glasses are defined herein as glasses that flow prior to crystallization (i.e., the exotherm of crystallization follows the softening and flow of the glass). Additionally, the glasses of the present invention form a crystalline material upon heating (i.e., a crystallized glass is present in the remnant glass). The chemistry of the crystals formed upon heating are different to the chemistry of the parent glass (prior to heating). Additionally, the ceramic filler present in the glasses of the present invention may form crystals upon reaction with the remnant glass. "Remnant glass" is herein defined as the glass of the composition that has not crystallized. The glasses of the present invention are present in the composition in the range of 25 to 100 weight %, based on solids.

One embodiment of the present invention is a glass composition consisting essentially of, based on mole percent, 46-56% $B_2O_3$, 0.5-8.5% $P_2O_5$, $SiO_2$ and mixtures thereof, 20-50% CaO, 2-15% $Ln_2O_3$ where Ln is selected from the group consisting of rare earth elements and mixtures thereof; 0-6% $M'_2O$ where M' is selected from the group consisting of alkali elements; and 0-10% $Al_2O_3$, with the proviso that the composition is water millable. A further embodiment is the composition above wherein $Ln_2O_3$ is $La_2O_3$. Still, a further embodiment is the composition above wherein $M'_2O$ is selected from the group consisting of $Li_2O$, $Na_2O$ and mixtures thereof.

The composition of glass(es) of the present invention is shown in Table 1 below:

TABLE 1

Glass Powder Compositions

| Item # | SiO2 | Al2O3 | ZrO2 | B2O3 | CaO | La2O3 | Na2O | Li2O | GeO2 | P2O5 | Density g/cc |
|---|---|---|---|---|---|---|---|---|---|---|---|
| 1 | | | | 42.16 | 16.98 | 39.47 | 0.94 | 0.45 | | | 3.52 |
| 2 | | | | 37.19 | 16.37 | 38.05 | 0.90 | 0.44 | | 7.05 | 3.48 |
| 3 | | 2.65 | | 34.20 | 15.65 | 36.38 | 0.87 | 0.42 | | 9.83 | 3.12 |
| 4 | | 4.18 | | 37.95 | 15.28 | 35.52 | 0.84 | 0.41 | | 5.82 | 3.36 |
| 5 | | | 3.02 | 36.72 | 16.16 | 37.56 | 0.89 | 0.43 | | 5.22 | 3.52 |
| 6 | | | | 36.91 | 16.34 | 37.97 | 0.90 | 0.44 | | 7.44 | 3.46 |
| 7 | | | | 36.89 | 16.24 | 37.73 | 0.90 | 0.43 | 2.57 | 5.24 | 3.53 |
| 8 | | | | 36.69 | 16.31 | 37.91 | 0.90 | 0.43 | | 7.76 | 3.33 |
| 9 | | | 6.26 | 35.39 | 15.84 | 36.80 | 0.88 | 0.42 | | 4.41 | 3.57 |
| 10 | | | 1.42 | 36.14 | 16.17 | 37.58 | 0.89 | 0.43 | | 7.37 | 3.49 |
| 11 | | | | 39.66 | 16.98 | 39.47 | 0.94 | 0.45 | | 2.50 | 3.45 |
| 12 | 1.10 | | | 41.06 | 16.98 | 39.47 | 0.94 | 0.45 | | | 3.54 |
| 13 | 1.61 | | | 40.55 | 16.98 | 39.47 | 0.94 | 0.45 | | | 3.57 |
| 14 | 2.14 | | | 40.02 | 16.98 | 39.47 | 0.94 | 0.45 | | | 3.60 |
| 15 | 1.10 | | | 38.56 | 16.98 | 39.47 | 0.94 | 0.45 | | 2.50 | 3.42 |
| 16 | | | | 40.96 | 16.98 | 39.47 | 0.94 | 0.45 | | 1.2 | 3.52 |
| 17 | | | | 42.88 | 16.07 | 37.36 | 0.89 | 0.43 | | 2.37 | 3.44 |
| 18 | 2.68 | | | 39.48 | 16.98 | 39.47 | 0.94 | 0.45 | | | 3.52 |
| 19 | 3.21 | | | 38.95 | 16.98 | 39.47 | 0.94 | 0.45 | | | 3.51 |
| 20 | 2.14 | | | 33.02 | 16.98 | 39.47 | 0.94 | 0.45 | | 7.00 | 3.55 |

TABLE 1-continued

Glass Powder Compositions

Mole %

| Item # | SiO2 | Al2O3 | ZrO2 | B2O3 | CaO | La2O3 | Na2O | Li2O | GeO2 | P2O5 |
|---|---|---|---|---|---|---|---|---|---|---|
| 1 | | | | 57.14 | 28.57 | 11.43 | 1.43 | 1.43 | | |
| 2 | | | | 52.28 | 28.57 | 11.43 | 1.43 | 1.43 | | 4.86 |
| 3 | | 2.58 | | 48.87 | 27.77 | 11.11 | 1.39 | 1.39 | | 6.89 |
| 4 | | 3.96 | | 52.62 | 26.30 | 10.52 | 1.32 | 1.32 | | 3.96 |
| 5 | | | 2.40 | 51.66 | 28.23 | 11.29 | 1.41 | 1.41 | | 3.60 |
| 6 | | | | 52.00 | 28.57 | 11.43 | 1.43 | 1.43 | | 5.14 |
| 7 | | | | 51.66 | 28.23 | 11.29 | 1.41 | 1.41 | 2.40 | 3.60 |
| 8 | | | | 51.77 | 28.57 | 11.43 | 1.43 | 1.43 | | 5.37 |
| 9 | | | 5.01 | 50.14 | 27.86 | 11.14 | 1.39 | 1.39 | | 3.07 |
| 10 | | | 1.14 | 51.14 | 28.41 | 11.36 | 1.42 | 1.42 | | 5.11 |
| 11 | | | | 54.70 | 29.08 | 11.63 | 1.45 | 1.45 | | 1.69 |
| 12 | 1.72 | | | 55.52 | 28.51 | 11.40 | 1.43 | 1.42 | | |
| 13 | 2.52 | | | 54.77 | 28.47 | 11.39 | 1.43 | 1.42 | | |
| 14 | 3.34 | | | 54.00 | 28.44 | 11.38 | 1.42 | 1.42 | | |
| 15 | 1.75 | | | 53.06 | 29.00 | 11.60 | 1.45 | 1.45 | | 1.69 |
| 16 | | | | 55.98 | 28.81 | 11.52 | 1.45 | 1.44 | | 0.80 |
| 17 | | | | 57.96 | 26.98 | 10.79 | 1.35 | 1.35 | | 1.57 |
| 18 | 4.18 | | | 53.21 | 28.41 | 11.36 | 1.42 | 1.42 | | |
| 19 | 5.00 | | | 52.43 | 28.38 | 11.35 | 1.42 | 1.42 | | |
| 20 | 3.52 | | | 46.80 | 29.88 | 11.95 | 1.49 | 1.49 | | 4.87 |

Composition #1 of Table 1 is a reference composition from U.S. Pat. No. 6,147,019 (#16) and is not part of the current invention.

The glasses in Table 1 are normally used only in the context of a formulation to make a tape dielectric. A typical formulation of the tape solids used in comparative testing consists of the following:

| Glass Powder | 48 volume % |
|---|---|
| Alumina | 52 volume % |

Figure 2:
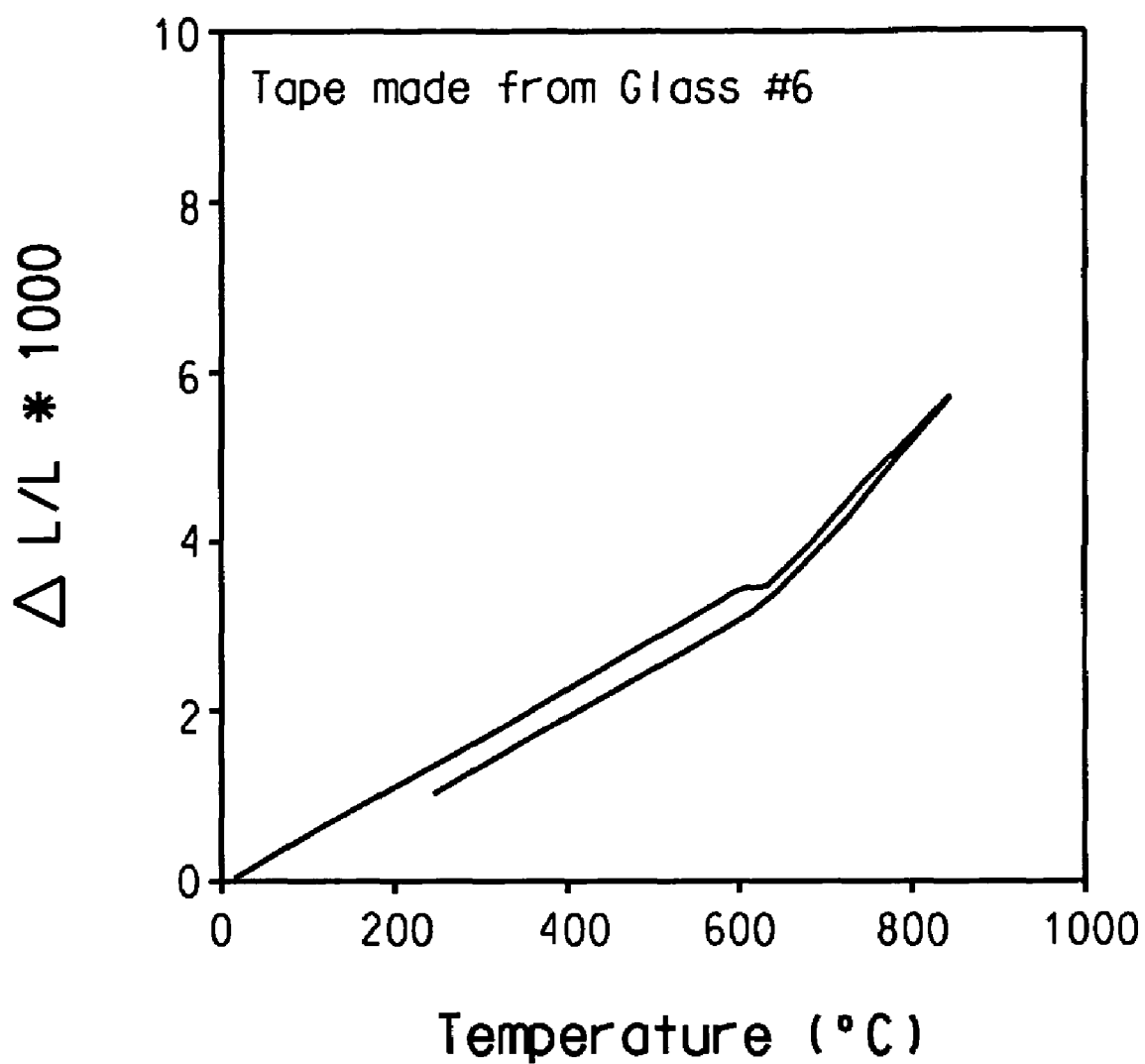
FIG. 2 shows that the tape based upon substituting glass #6 in the tape formulation results in a relatively stable heat and cool characteristic.
Figure 3:
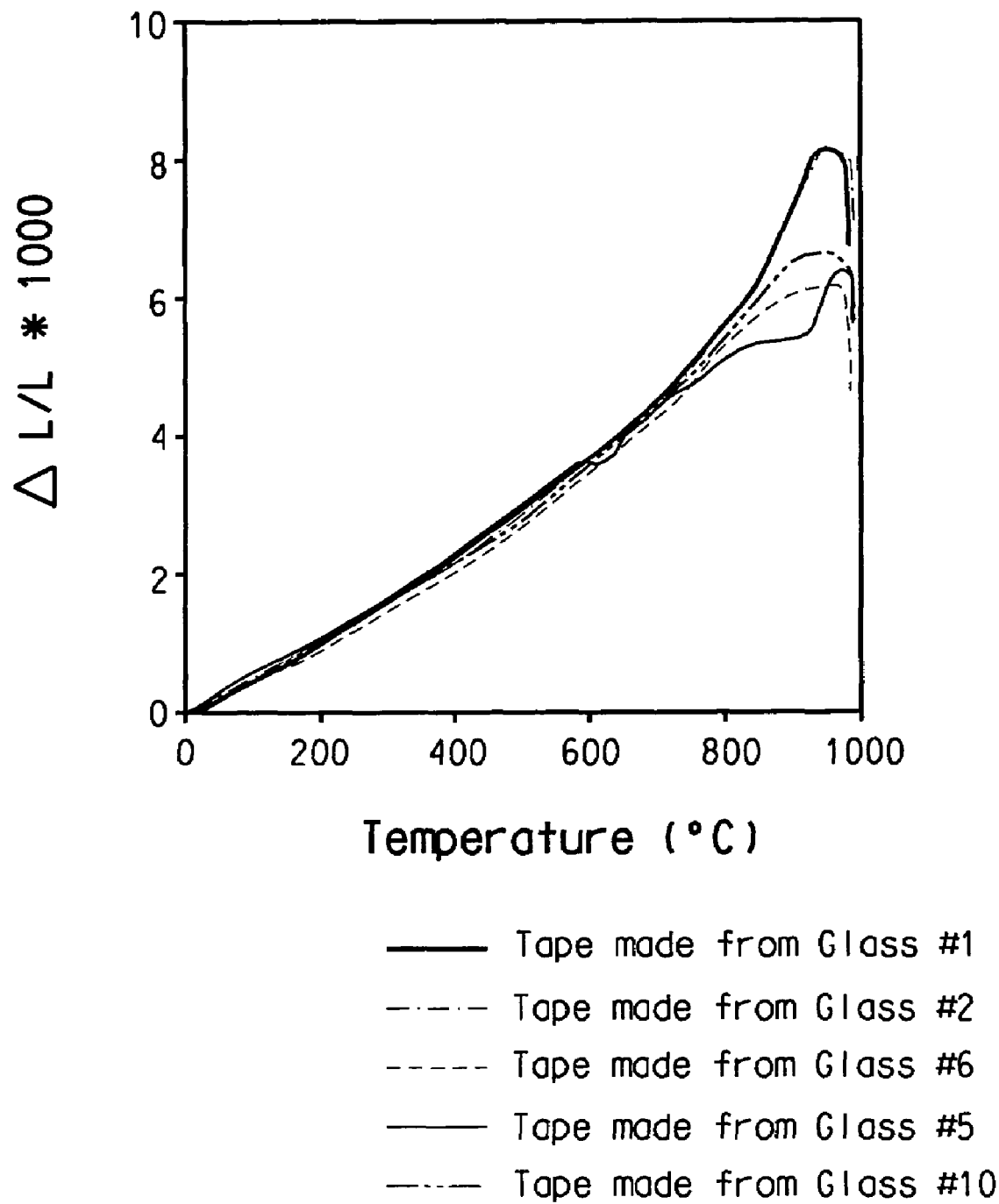
FIG. 3 shows the stability characteristics of tapes made with a variety of glass compositions when the heating program of the dilatometer is increased to approach a 1000° C., while heating at 3 C/min.

The thermal expansion behavior taken upon both the heating and cooling of the glass #1 in a tape formulation is shown in the FIG. 1. The data in FIGS. 1, 2 and 3 were obtained by a fused silica dilatometer on 2-inch length specimens. The dilatometer was calibrated by regression fitting to the expansion over the thermal range tested for a sapphire standard. The data for FIGS. 1 and 2 were taken upon heating at 4.5° C./min. to 865° C. soaking for 3 min. then cooling at 3° C./min. to 250° C.

In FIG. 1, the heating and cooling paths are separated in a way that indicates the yield that is still possible when fired to 850° C. in a belt furnace then re-measured in a fused silica dilatometer to 865° C. This indicates that the composite of crystal and residual glass is yielding under the loading applied during the measurement (0.05 newton). Typically, if the crystal development has become dominant, the yield in the microstructure would not occur. For this reason, it is expected that the residual glassy phase is still controlling the yield characteristic in glass #1 tape. The presence of a low viscosity residual glass is potentially a reason for reaction with buried Ag conductor lines causing the observed conductivity changes with refires and/or circuit opens in the case of conductor lines and spaces of small dimensions (<0.15 mm).

In contrast to the thermal expansion behavior of the glass #1 tape, the tape based upon substituting glass #6 in the tape formulation (FIG. 2) results in a relatively stable heat and cool characteristic. This would suggest that the fired glass #6 tape has achieved a more refractory state than that of the glass #1 tape. The result is that less yield in the tape is possible upon re-heating the fired tape to 865° C. and cooling. This likely indicates that the residual glass is more refractory or that the crystal development has become more dominant in the microstructure of the fired tape body. The most likely result is that the remnant glass is more refractory.

If the heating program of the dilatometer is increased to approach a 1000° C., while heating at 3 C/min., the stability characteristics of tapes made with varied glass compositions can be seen in FIG. #3.

The tape made with glass #6 tape shows good stability to temperatures in excess of 950° C. Whereas, the glass #1 tape shows a significant volume expansion characteristic at temperatures above 850 C and deforms somewhat before 950° C. The glass #10 tape is located between the glass #1 tape and glass #6 tape expansion behavior. These characteristic differences suggest that the remnant glass is in a smaller proportion to the crystal or that the composite viscosity of the glass is higher for the glass #6 tape as shown in the increased refractory performance of the thermal expansion data. The improvement in refractory performance would be expected to improve the compatibility with conductor materials. This improved refractory performance for the substitution of $P_2O_5$ for $B_2O_3$ in the glass #6 tape unexpectedly shows a reduction on the dielectric constant ($E_r$) and dielectric loss (tangent delta) as can be seen in Table 2 below.

U.S. Pat. No. 6,147,019 to Donohue discloses that the substitution of $SiO_2$ for $B_2O_3$ is adverse to the tape dielectric loss for even small additions (column 2, line 5). So, the current invention that substitutes glass formers including $P_2O_5$, $GeO_2$, and $SiO_2$ is not taught in the prior art and is unexpected to have benefit. In fact, Donohue teaches away from the present invention.

The measurement of dielectric constant, $E_r$ and dielectric loss (tangent delta) has been performed for selected samples of tape made from the glasses indicated in Table 2. These measurements were performed using a (non-metallized) split cavity method in a range of frequency from 3.3 GHz to 16 GHz. A reference to the measurement method is given in "Full-Wave Analysis of a Split-Cylinder Resonator for Non-destructive Permittivity Measurements" by Michael Janezic published in IEEE Transactions on Microwave Theory and Techniques, Vol 47, No. 10, October 1999. Data for two frequencies are provided in Table 2. The data, ($E_r$ and loss), for all measured samples shows a very slight increase with frequency. It is also apparent from the data in Table 2 that improvements (Lower $E_r$ and Loss) in the attained LTCC tape properties are yielded from the substitution for $B_2O_3$ of either $P_2O_5$ or $SiO_2$ as in glasses 6, 14, and 15. It is also important to note that some variation in attained dielectric properties is expected due to small experimental errors in the measurements.

TABLE 2

Dielectric Properties of Fired Tape Samples

| Glass # | 3.3 GHz $E_r$ | Tan Delta | 8.3 GHz $E_r$ | Tan Delta |
|---|---|---|---|---|
| 1 | 7.40 | 0.00130 | 7.57 | 0.00100 |
| 2 | 7.08 | 0.00110 | 7.13 | 0.00098 |
| 3 | | | | |
| 4 | | | 7.44 | 0.00120 |
| 5 | 7.30 | 0.00110 | 7.34 | 0.00130 |
| 6 | 7.28 | 0.0008 | 7.31 | 0.0009 |
| 7 | | | | |
| 8 | | | | |
| 9 | | | | |
| 10 | | | | |
| 11 | | | | |
| 12 | | | | |
| 13 | | | | |
| 14 | 6.90 | 0.00065 | 6.92 | 0.00075 |
| 15 | 7.10 | 0.00048 | 7.12 | 0.00059 |
| 16 | | | | |
| 17 | | | | |
| 18 | | | | |
| 19 | | | | |
| 20 | | | 6.7 | 0.0011 |

Note:
Data for glass #20 taken at 9.4 GHz

Figure 4:
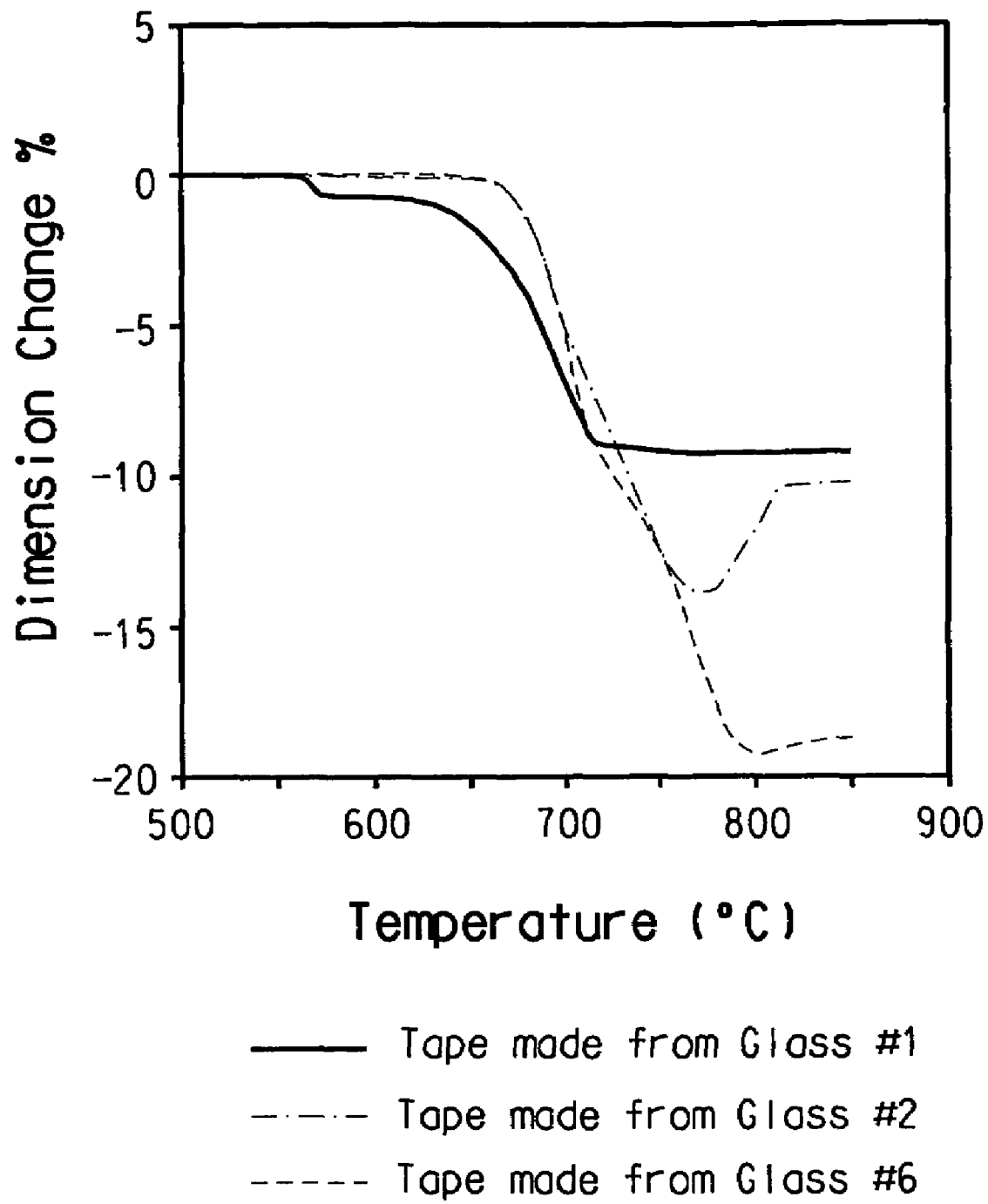
FIG. 4 shows the Thermo-Mechanical Analysis (TMA) properties of the glass #1 tape, glass #2 tape and the glass #6 tape.

The Thermo-Mechanical Analysis (TMA) properties of the glass #1 tape, glass #2 tape and the glass #6 tape are shown in FIG. 4. The TMA measurements were performed using a TA Instruments Inc. TMA using a heating program of room temperature to 850° C. at 10° C./min. The temperature of 850° C. was held for 5 minutes, then power off for all samples. The glass #1 tape is seen to initiate sintering earlier than the glass #6 or glass #2 tape; it is also seen to develop a critical volume of crystal more quickly than glass #6 or glass #2 tape resulting in less dimensional change (tape shrinkage). This is shown by the attenuation of deformation under the loading. The glass #2 tape shows the influence of the abrupt glass volume expansion (between 780° C.-810° C.) that is seen in the TCE characteristic of glass #2. The glass #6 tape does not have the same volume expansion characteristic for the glass and the tape shows continuous deformation until the composite viscosity increase rigidities the tape.

Figure 5:
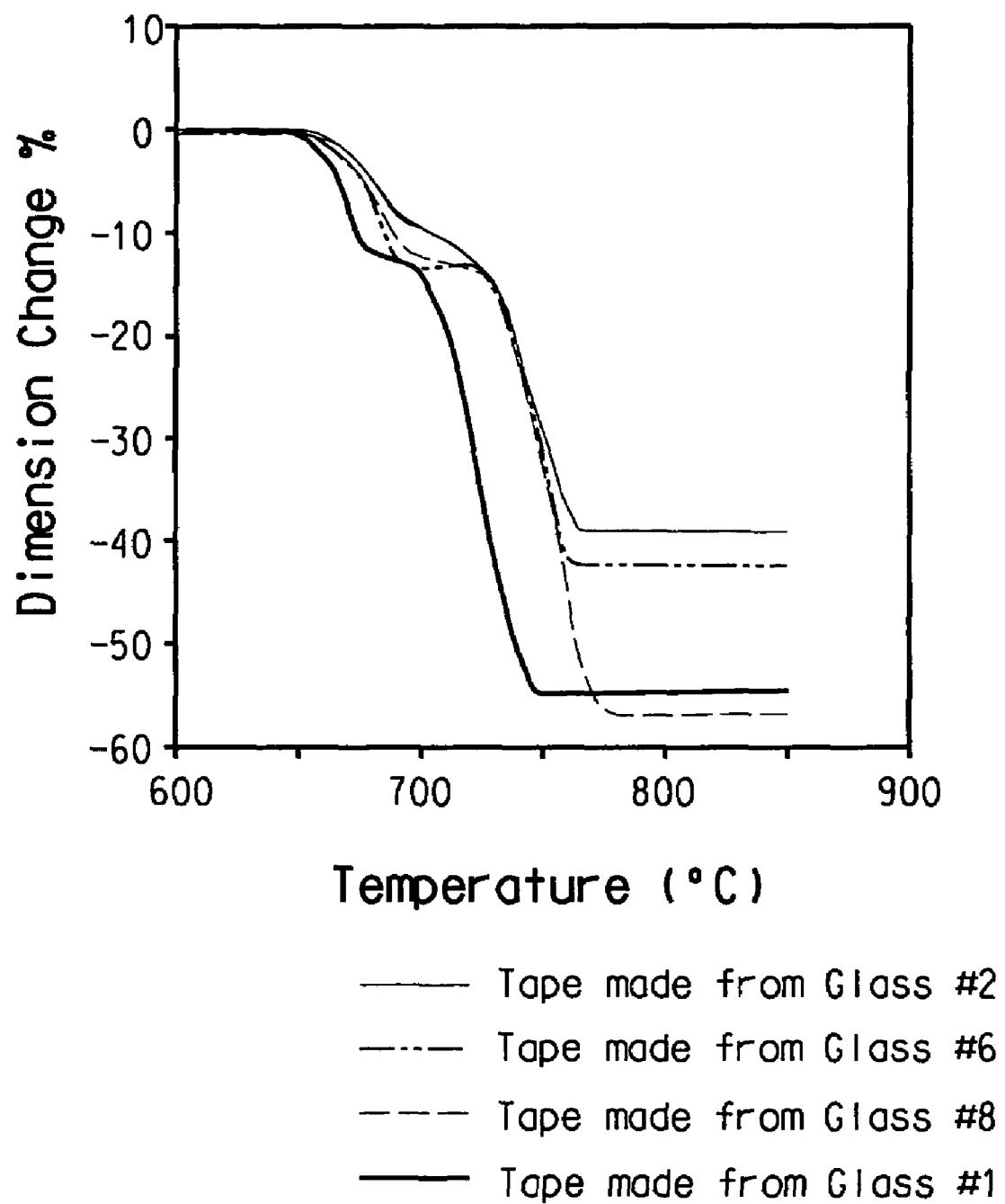
FIG. 5 shows that the TMA property of the glass alone.

The TMA property of the glass alone is shown in FIG. 5. The glass #1 is seen to onset sintering and flow at lower temperatures than the glasses of the current invention. Both glass #2 and glass #6 exhibit less shrinkage before dimensional stability is achieved due to the development of a crystallizable phase. The crystalline phase development is estimated to be in excess of 50 volume % by comparison with other crystallizable glasses characterized by TMA and X-ray methods to estimate crystalline content.

Figure 6:
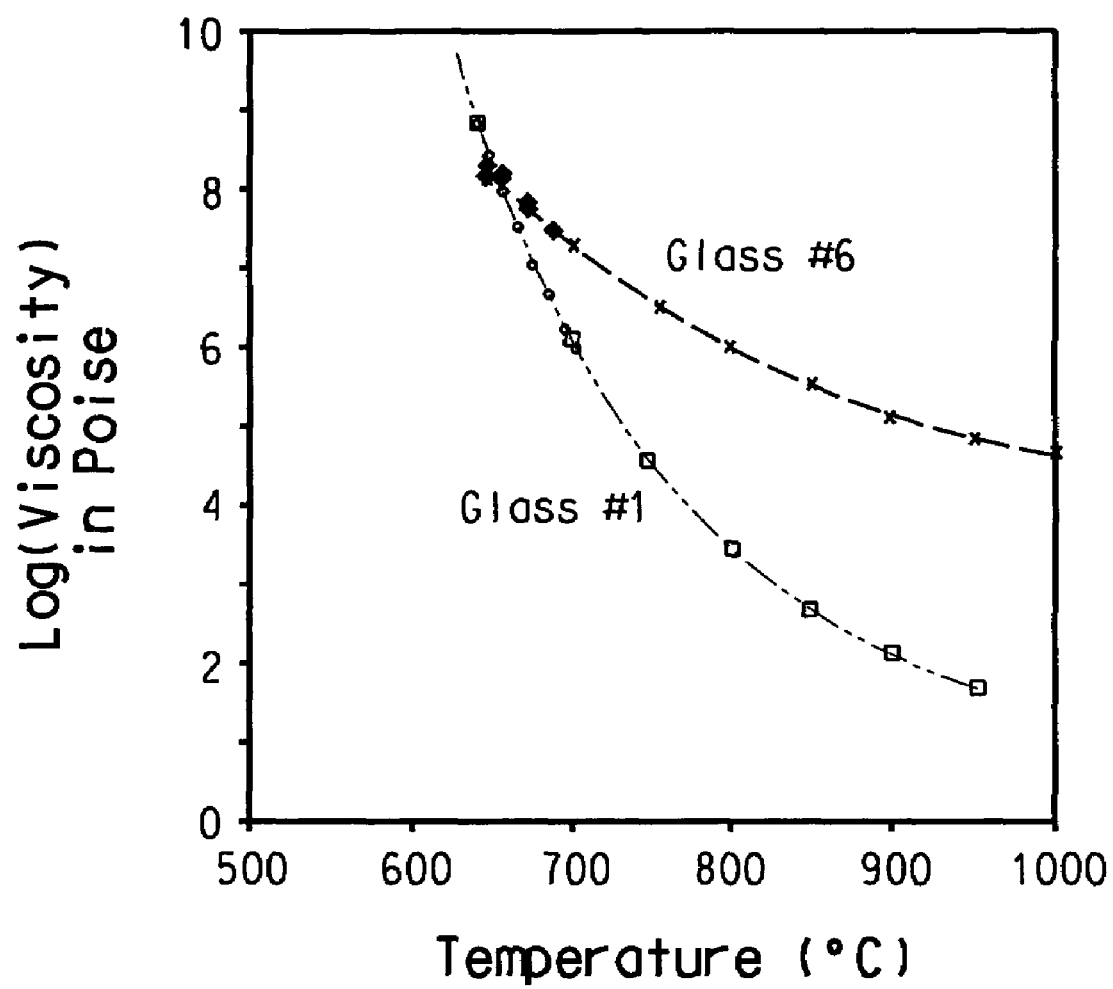
FIG. 6 shows the effect on glass viscosity of the substitution of $P_2O_5$ for $B_2O_3$ in the glass composition.

As can be seen from the glass viscosity data provided in the FIG. 6, the substitution of $P_2O_5$ for $B_2O_3$ in the glass composition raises the glass viscosity. The glass viscosity has been measured by the parallel plate method in the viscosity region between log(viscosity)=5 to 10. The parallel plate method used is the type 1 described by G. J. Dienes and H. F. Klemm (J. Applied Physics, 17(6) p 458, 1946). The measurement data has been fitted and extrapolated with some risk to accuracy beyond the measurement region. This increase in viscosity is expected due to the formation of refractory $BPO_4$ structural groups as $P_2O_5$ is added to a predominantly borate glass.

Other glass former and intermediate oxides are known to increase glass viscosity. Substitution of $GeO_2$, $SiO_2$ and $ZrO_2$ are also represented in the compositions listed in Table 1. However, not all viscosity enhancing additions produce desired improvements in the stability properties of tape made from the modified glasses. To those skilled in the art, the addition of other glass former oxides such as $GeO_2$, or $SiO_2$ may be used in combination or singly to modify the viscosity properties of a high borate glasses with similar benefits to tape stability properties as $P_2O_5$. The low viscosity property of high borate glasses is known to make the control of glass and tape properties more difficult to control in a manufacturing operation. For this reason, it would appear obvious to apply the teaching of this patent to other high borate glasses to improve the firing stability, conductor compatibility and dielectric properties of other LTCC dielectrics. The addition of $P_2O_5$ in the range of 0.5-8.5 mole % for $B_2O_3$ in the glass composition has the unexpected result of enhancement of tape dielectric properties. The Ag based conductor interaction with the tape dielectric is also significantly improved as will be described in a later section on conductor compatibility testing.

The compositions of Table 1 that have $SiO_2$ additions have shown significant improvement in the compatibility with Ag based conductor lines. The tendency to interact in proximity to Ag conductor lines is suppressed in the tape compositions tested that were made from glasses 12, 13, 14, 15, 18 and 19. This result was not taught in Donohue. The dielectric loss properties reported in Table 2 unexpectedly shows that the addition of $SiO_2$ in composition 14 substantially reduces the electrical loss characteristics of the tape dielectric. The composition 15 shows the largest reduction in dielectric loss, as compared with composition 1. This reduced loss result is also likely but not measured for compositions 12 and 13. The low addition levels of $SiO_2$ addition to glass shown in this case was not reported in Donohue. The addition of $SiO_2$ was indicated as not beneficial to dielectric loss.

The compositional range demonstrated in this testing is as follows: $B_2O_3$ 46-58 mole %, CaO 28-29 mole %, $La_2O_3$ 10-12 mole %, $Na_2O$ 1.3-1.5 mole %, $Li_2O$ 1.3-1.5 mole %, $P_2O_5$ 0.-5.5 mole %, $SiO_2$ 0-5.5 mole %. In order to gain the performance advantages shown in the experimental data over the reference composition 1, a minimum of 0.5 mole % of $SiO_2$, $P_2O_5$, or both must be substituted for $B_2O_3$. Although testing has been conducted on glass compositions formulated to make LTCC tape that contains primarily one additional glass former, such as $SiO_2$, $P_2O_5$, $GeO_2$ etc. at a time, more than one glass former maybe used to modify this predominately borate glass by those skilled in the art. It is expected that equivalent benefits to the manufacture of similar low loss LTCC tapes based upon high borate glasses would be expected by using the teachings of this case.

Glass Preparation Procedures

The glasses were melted in platinum crucibles at a temperature in the range of 1350-1450° C. The batch materials were oxide forms with the exception of lithium carbonate, sodium carbonate and calcium carbonate. The phosphorous pentoxide was added in the form of a pre-reacted phosphate compound, such as $Ca_2P_2O_7$, $Na_3P_3O_9$, $LiPO_3$, or $BPO_4$. The glass was melted for 0.5-1 hour, stirred, and quenched. The glass may be quenched in water or by metal roller. The glass was then ball milled in water to a 5-7 micron powder. The glass slurry was screened through a 325-mesh screen. The slurry was dried then milled again to a final size of about 1-3 micron D50. The dried glass powder was then ready to be used in the tape formulation to make a tape.

Ceramic fillers (refractory oxide(s)) such as $Al_2O_3$, $ZrO_2$, $SiO_2$, $TiO_2$ or mixtures thereof may be added to the castable dielectric composition in an amount of 0-75 weight %, based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts with the glass to form an Al-containing crystalline phases. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, a-quartz, $CaZrO_3$, mullite, cordierite, forsterite, zircon, zirconia, $BaTiO_3$, $CaTiO_3$, $MgTiO_3$, amorphous silica or mixtures thereof may be used to modify tape performance and characteristics. The amount of filler, type of filler and physical characteristics of the filler will influence the shrinkage of the fired green tape. Tape shrinkage maybe adjusted to controlled levels by the use of a multi-modal particle size distribution optimized to reduce shrinkage by increasing filler packing density.

The slurry and/or tape composition may further comprise 0-5 weight % $Cu_2O$, based on solids.

In the formulation of tape compositions, the amount of glass relative to the amount of ceramic material is important. A filler range of 40-55% by weight is considered desirable in that the sufficient densification is achieved. If the filler concentration exceeds 60% by wt., the fired structure is not sufficiently densified and is too porous. Within the desirable glass to filler ratio, it will be apparent that, during firing, the filler phase will become saturated with liquid glass.

For the purpose of obtaining higher densification of the composition upon firing, it is important that the inorganic solids have small particle sizes. In particular, substantially all of the particles should not exceed 15 µm and preferably not exceed 10 µm. Subject to these maximum size limitations, it is preferred that at least 50% of the particles, both glass and ceramic filler, be greater than 1 µm and less than 6 µm.

The organic medium in which the glass and ceramic inorganic solids are dispersed is comprised of an organic polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids (which includes glass and ceramic filler), based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0-100% wt. $C_{18}$ alkyl methacrylate, 100-0% wt. $C_{1-8}$ alkyl acrylate and 0-5% wt. ethylenically unsaturated carboxylic acid or amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly (isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1, 3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

Application

A green tape is formed by casting a thin layer of a slurry dispersion of the glass, ceramic filler, polymeric binder and solvent(s) as described above onto a flexible substrate, heating the cast layer to remove the volatile solvent. This forms a solvent-free tape layer. The tape is then blanked into sheets or collected in a roll form. The green tape is typically used as a dielectric or insulating material for multilayer electronic circuits. A sheet of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser or other method(s) can be used to volatilize and form via holes in the green tape. Typical via hole sizes range from 0.1 to 6.4 mm. The interconnections between layers are formed by filling the via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. The laminate assemblies are trimmed with a hot stage cutter. Firing is typically carried out in a standard thick film conveyor belt furnace or in a box furnace with a programmed heating cycle. This method will, also, allow top and/or bottom conductors to be co-fired as part of the constrained sintered structure without the need for using a conventional release tape as the top and bottom layer, and the removal, and cleaning of the release tape after firing.

The dielectric properties of the fired tape (or film) of the present invention depend on the quantity and/or quality of total crystals and glasses present. The low temperature co-fired ceramic (LTCC) device dielectric properties also depend on the conductor used. The interaction of conductor with the dielectric tape may, in some embodiments, alter the chemistry of the dielectric portion of the device. By adjusting the heating profile and/or changing the quality and/or quantity of the filler in the tape and/or chemistry of the conductor, one skilled in the art could accomplish varying dielectric constant and/or dielectric loss values.

As used herein, the term "firing" means heating the assembly in an oxidizing atmosphere such as air to a temperature, and for a time sufficient to volatilize (burn-out) all of the organic material in the layers of the assemblage to sinter any glass, metal or dielectric material in the layers and thus densify the entire assembly.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

It should also be recognized that in multilayer laminates having greater than 10 layers typically require that the firing cycle may exceed 20 hours to provide adequate time for organic thermal decomposition.

The use of the composition(s) of the present invention may be used in the formation of electronic articles including multilayer circuits, in general, and to form microwave and other high frequency circuit components including but not limited to: high frequency sensors, multi-mode radar modules, telecommunications components and modules, and antennas.

These multilayer circuits require that the circuit be constructed of several layers of conductors separated by insulating dielectric layers. The insulating dielectric layer may be made up of one or more layers of the tape of the present invention. The conductive layers are interconnected between levels by electrically conductive pathways through a dielectric layer. Upon firing, the multilayer structure, made-up of dielectric and conductive layers, a composite is formed which allows for a functioning circuit (i.e. an electrically functional composite structure is formed). The composite as defined herein is a structural material composed of distinct parts resulting from the firing of the multilayer structure which results in an electrically functioning circuit.

EXAMPLES

Tape compositions used in the examples were prepared by ball milling the fine inorganic powders and binders in a volatile solvent or mixtures thereof. To optimize the lamination, the ability to pattern circuits, the tape burnout properties and the fired microstructure development, the following volume % formulation of slip was found to provide advantages. The formulation of typical slip compositions is also shown in weight percentage, as a practical reference. The inorganic phase is assumed to have a specific density of 3.5 g/cc for glass and 4.0 g/cc for alumina and the organic vehicle is assumed to have a specific density of 1.1 g/cc. The weight % composition changes accordingly when using glass and oxides other than alumina as the specific density maybe different than those assumed in this example.

|  | Volume % | Weight % |
|---|---|---|
| Inorganic phase | 41.9 | 73.8 |
| Organic phase | 58.1 | 26.2 |

The above volume and weight % slip composition may vary dependent on the desirable quantity of the organic solvent and/or solvent blend to obtain an effective slip milling and coating performance. More specifically, the composition for the slip must include sufficient solvent to lower the viscosity to less than 10,000 centipoise; typical viscosity ranges are 1,000 to 4,000 centipoise. An example of a slip composition is provided in Table 3. Depending on the chosen slip viscosity, higher viscosity slip prolongs the dispersion stability for a longer period of time (normally several weeks). A stable dispersion of tape constituents is usually preserved in the as-coated tape.

TABLE 3

Slip Composition

| Component | Weight % |
|---|---|
| Acrylate and methacrylate polymers | 18.3 |
| Phthalate type plasticizers | 1.8 |
| Ethyl acetate/isopropyl alcohol mixed solvent | 15.2 |
| Glass powder | 27.9 |
| Alumina powder | 36.8 |

If needed, a preferred inorganic pigment at weight % of 0.1 to 1.0 may be added to the above slip composition before the milling process.

Glass Powder Preparation

The glasses for the Examples found herein were all melted in Pt/Rh crucibles at 1350-1450° C. for about 0.5-1 hours in an electrically heated furnace. Glasses were quenched by pouring into water, removed quickly and dried as a preliminary step and then subjected to particle size reduction by milling in water. The powders prepared for these tests were adjusted to a 1-3 micron mean size by ball milling and screening. The mill slurry is dried in a hot air oven and de-agglomerated by screening. The glass, alumina, and tape medium are milled together to produce a slip suitable for forming a tape by casting the slurry on a polymer based carrier substrate. The tape is cast using tape casting equipment forming a layer of uniform dimension and dried to form a flexible tape of typically about 0.11 mm thickness.

Chemical Durability Test

Ten layers of tape were laminated to form samples having post fire dimensions of 2.5×2.5 mm. The samples were fired in a standard LTCC heating profile (190 min. door to door) and dipped in two different mineral acids of 10% acid strength kept at constant temperature of 40° C., for a constant period of time of 30 minutes each respectively. The weight loss (difference in % of weight) due of leaching of tape components into acid were taken as the measure of chemical durability. Two commercially available LTCC tapes, 951-AT and 943-A5, (Dupont Company, Wilmington Del.) were used as the control. Results are given below:

| | % Weight loss | |
|---|---|---|
| Sample | HCL | H2SO4 |
| LTCC (Present Invention) | 0.10 | 0.11 |
| 943-A5 (Low loss LTCC) | 0.42 | 0.23 |
| 951-AT (Standard LTCC) | 0.01 | 0.01 |

The chemical resistance of the current invention is substantially improved over the standard 943 tape.

Mechanical Strength

Ten layers of "Green tapes" were laminated and fired using a standard LTCC heating profile. The modulus of rupture of several duplicated parts was measured and the average values are given below:

| Sample | Modulus of Rupture (psi) |
|---|---|
| LTCC (present invention) | 28.900 |
| 943-A5 (low loss LTCC) | 26.200 |
| 951-AT (standard LTCC) | 30.000 |

These results indicate that similar strength was attained in all tape materials.

Processing Latitude

Ten layers of "green tapes" were laminated and fired using three different heating profiles, keeping the maximum firing temperature and time at maximum temperature constant at 850° C. for 10 minutes. The total time for three heating profiles were 75 minutes, 190 minutes and 380 minutes.

Two dielectric properties, dielectric constant and dielectric loss, were measured at a constant frequency of 8-9 GHz and taken as the measure of the processing latitude. Results are given below:

| | Dielectric Constant (K) | | | Dielectric loss (%) | | |
|---|---|---|---|---|---|---|
| Profile | 1 | 2 | 3 | 1 | 2 | 3 |
| LTCC (Tape - glass #2) | 6.94 | 6.41 | 6.13 | 0.14 | 0.08 | 0.11 |
| LTCC (Tape - glass #6) | 7.34 | 7.28 | 7.12 | 0.12 | 0.09 | 0.08 |
| 943-A5 (low loss LTCC) | 7.66 | 7.57 | 7.41 | 0.13 | 0.10 | 0.09 |
| 951-AT (standard LTCC) | 7.53 | 7.51 | 7.54 | 0.74 | 0.68 | 0.43 |

The dielectric constant and loss are reduced for the LTCC tape based upon glass #6. The rate of heating of the tape laminates shows a progressive reduction in dielectric properties for most all tape samples.

In additional studies of the effect of temperature, the 190 minute profile was used to fire tape laminates made with glass #2 at 825, 850, and 875 C. for a period of 10 minutes. The results are given below:

| Peak Temperature | Dielectric Constant (K) | Dielectric loss (%) |
|---|---|---|
| 825 C. | 6.40 | 0.10 |
| 850 C. | 6.41 | 0.08 |
| 875 C. | 6.35 | 0.07 |

When the heating profile is fixed and the peak soak temperature is changed as a simulation to process latitude, the properties are observed to vary only slightly, thus indicating good process latitude. The properties of tapes made from glass from the current invention are observed to improve both the desirability of the dielectric properties obtained and the stability with which the properties can be reproduced.

The dielectric properties of the fired film of this invention, which is a "devitrified glass-ceramic composite", the properties of which depend on the quantity and quality of total crystals and the remnant glass present in the composite. The LTCC dielectric properties also depend on the conductor film which is a "metal—devitrified glass-ceramic composite". By adjusting the heating profile, a knowledgeable practitioner could alter the ratios of components present in the fired film and thus accomplish lower dielectric constant and/or better dielectric losses.

Tape Shrinkage and Refire Stability

The shrinkage values have been measured then calculated using the "Hypotenuse" method, known to those skilled in the art. All parts were fired at 850° C. following a standard green tape firing profile. The refires were conducted at 850° C. using a 30-minute above 800° C. profile.

| | Dimensional Shrinkage in % | | | |
|---|---|---|---|---|
| Sample | Initial | 1× | 2× | 3× |
| LTCC current invention | | | | |
| Part 1 | 11.35 | 11.32 | 11.27 | 11.24 |
| Part2 | 11.35 | 11.29 | 11.26 | 11.23 |

-continued

| | Dimensional Shrinkage in % | | | |
|---|---|---|---|---|
| Sample | Initial | 1× | 2× | 3× |
| 943-A5 | | | | |
| Part 1 | 9.92 | 9.80 | 9.71 | 9.66 |
| Part 2 | 9.52 | 9.42 | 9.36 | 9.34 |
| Part 3 | 9.34 | 9.20 | 9.10 | 9.04 |
| Part 4 | 9.27 | 9.17 | 9.11 | 9.09 |

The shrinkage data for the glass #1 based tape (943 commercial tape) shows more variation between parts and with refires than the glass #6 based tape of the current invention. This variation seen for the glass #1 tape makes manufacturing control of tape shrinkage more difficult than the tape made using the current invention. The variation of the improved tape is on the order of 0.11-0.12 between initial and 3× refired. The variation of the standard tape ranges 0.3-0.18 for the same conditions. Since the acceptable tolerance for the manufacturing specification for shrinkage is +/−0.3%, it yields marginal process control. However, the variation in shrinkage between parts is largest source of variability. The initial firing of the 943 tape shows a difference of 0.65. This exceeds the variation required in application. The improved tape shows very little part to part variation and can be made to meet current dimensional stability standards.

Conductor Compatibility/Re-fire Stability

Figure 7:
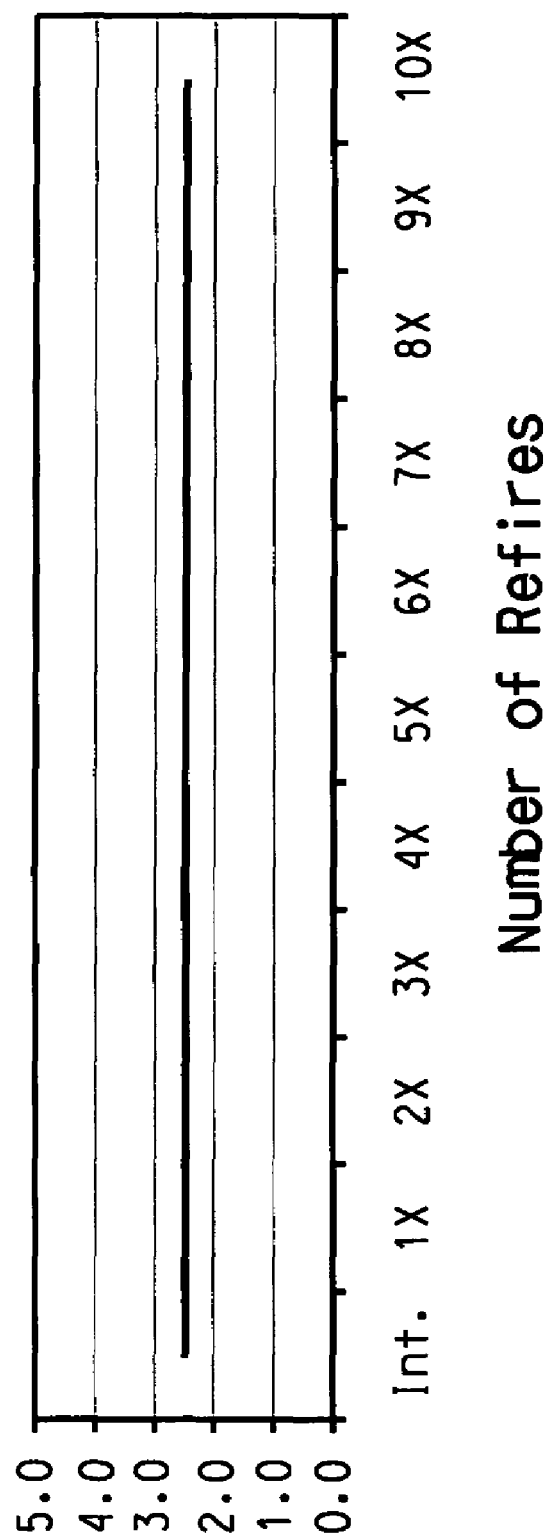
FIG. 7 shows the resistivity of the Ag based conductor as a function of the number of refires; the high level of stability is achieved in FIG. 7, using the current invention tape based upon the #6 glass.

"Daisy chain test", consisting of over 5000 squares of conductor lines and over 300 via-fill conductors connected in series was used to evaluate the conductor compatibility and re-fire stability of the system. After each firing, the resistivity was measured. Any conductor line break and/or conductor-via fill conductor separation should show in the test by giving infinite resistivity. No conductor opens were detected. The testing was performed on 0.05, 0.11, and 0.25 mm thickness tape with the same stability performance being shown (ie. no opens). The resistivity of the Ag based conductor as a function of the number of refires shows the high level of stability achieved in FIG. 7, using the current invention tape based upon the #6 glass.

Fired tape samples made from glass #14, #20 and #6 when compared to Glass #1 (Donohue reference) show no Ag interaction damage in proximity to buried conductor lines having 0.127 mm lines and spaces. The Glass #1 based tape in contrast shows localized conductor erosion in proximity of the buried conductor lines within the tape dielectric.

What is claimed is:

1. A glass composition consisting essentially of, based on mole percent, (i) 46- 57.96% $B_2O_3$, (ii) a glass network former selected from the group consisting of 0.5-8.5% $P_2O_5$, 1.72-5.00% $SiO_2$, and mixtures of $P_2O_5$ and $SiO_2$ wherein the combined mole % of said mixture of $P_2O_5$ and $SiO_2$ is 3.44-8.39%, (iii) 20-50% CaO, (iv) 2-15% $Ln_2O_3$ where Ln is selected from the group consisting of rare earth elements and mixtures thereof; (V) 0-6% M'$_2$O where M' is selected from the group consisting of alkali elements; and (vi) 0-10% $Al_2O_3$,
wherein said glass composition is a ceramic-filled, devitrified glass composition, wherein said glass composition flows prior to crystallization, and with the proviso that the composition is water millable.

2. The composition of claim 1 wherein $Ln_2O_3$ is $La_2O_3$.

3. The composition of claim 1 wherein M'$_2$O is selected from the group consisting of $Li_2O$, $Na_2O$ and mixtures thereof.

4. The glass composition of claim 1 wherein said glass network former is 0.5-8.5 mole % $P_2O_5$.

5. The glass composition of claim 1 wherein said glass network former is 1.72-5.00 mole % $SiO_2$.

6. The glass composition of claim 1 wherein said glass network former is a mixture of $P_2O_5$ and $SiO_2$ wherein the combined mole % of said mixture of $P_2O_5$ and 3i02 is 3.44-8.39%.

7. A composition comprising, based on solids:
(a) 25-100 weight % glass composition consisting essentially of, based on mole percent, (i) 46- 57.96% $B_2O_3$, (ii) a glass network former selected from the group consisting of 0.5-8.5% $P_2O_5$, 1.72-5.00% $SiO_2$, and mixtures of $P_2O_5$ and $SiO_2$ wherein the combined mole % of said mixture of $P_2O_5$ and $SiO_2$ is 3.44-8.39%, (iii) 20-50% Ca), (iv) 2-15% $Ln_2O_3$ where Ln is selected from the group consisting of rare earth elements and mixtures thereof; (v) 0-6% M'$_2$O where M' is selected from the group consisting of alkali elements; and (vi) 0-10% $Al_2O_3$, wherein said glass composition is a ceramic-filled, devitrified glass composition, wherein said glass composition flows prior to crystallization, and with the proviso that the composition is water millable;
(b) 0-75 weight % refractory oxide; both (a) and (b) dispersed in a solution of
(c) organic polymeric binder.

8. The composition of claim 7 further comprising a volatile organic solvent.

9. The composition of claim 7 further comprising 0-5 weight % $Cu_2O$.

10. The composition of claim 7 wherein the refractory oxide is $Al_2O_3$.

11. The composition of claim 7 wherein the GaO is partially substituted by BaO, MgO or mixtures thereof.

12. The composition of claim 7 wherein $Ln_2O_3$ is $La_2O_3$.

13. The composition of claim 7 wherein M'$_2$O is selected from the group consisting of $Li_2O$, $Na_2O$ and mixtures thereof.

14. The composition of claim 7 wherein said glass network former is 0.5-8.5 mole % $P_2O_5$.

15. The composition of claim 7 wherein said glass network former is 1.72-5.00 mole % $SiO_2$.

16. The composition of claim 7 wherein said glass network former is a mixture of $P_2O_5$ and $SiO_2$ wherein the combined mole % of said mixture of $P_2O_5$ and $SiO_2$ is 3.44-8.39%.

17. A green tape formed by casting a layer of the composition of claim 8 onto a flexible substrate forming a cast layer, and heating the cast layer to remove the volatile organic solvent forming a solvent-free layer.

18. The tape of claim 17 wherein the solvent-free layer is separated from the substrate.

19. The tape of claim 17 wherein a conductor composition is deposited on the tape.

20. The tape of claim 18 wherein a conductor composition is deposited on the tape.

21. The tape of claim 17 further comprising conductors and wherein said tape and conductors have been processed to form an electrically functional composite structure.

22. The tape of claim 18 further comprising conductors and wherein said tape and conductors have been processed to form an electrically functional composite structure.

23. An article comprising the tape of claim 17 wherein the tape is processed to volatilize the organic polymeric binder and sinter the glass composition.

24. An article comprising the tape of claim 18 wherein the tape is processed to volatilize the organic polymeric binder and sinter the glass composition.

* * * * *

UNITED STATES PATENT AND TRADEMARK OFFICE
CERTIFICATE OF CORRECTION

| | | |
|---|---|---|
| PATENT NO. | : 7,687,417 B2 | |
| APPLICATION NO. | : 11/543742 | |
| DATED | : March 30, 2010 | |
| INVENTOR(S) | : Kenneth Warren Hang, Kumaran Manikantan Nair and Mark Frederick McCombs | |

It is certified that error appears in the above-identified patent and that said Letters Patent is hereby corrected as shown below:

Column 4, Line 18: different to the chemistry should read different from the chemistry Column 7, Line 56: increase rigidities the tape should read increase has rigified the tape Column 16, Line 12: $3i0_2$ should read $Si0_2$ Column 16, Line 40: GaO should read CaO Signed and Sealed this
Tenth Day of April, 2012

David J. Kappos
*Director of the United States Patent and Trademark Office*